July 24, 1962 B. A. TREVOR 3,046,496

STABILIZED FREQUENCY MODULATED OSCILLATOR

Filed Jan. 21, 1959

INVENTOR.
BERTRAM A. TREVOR
BY
George T. Craig
ATTORNEY

United States Patent Office 3,046,496

Patented July 24, 1962

3,046,496

STABILIZED FREQUENCY MODULATED OSCILLATOR

Bertram A. Trevor, Tucson, Ariz., assignor to Radio Corporation of America, a corporation of Delaware Filed Jan. 21, 1959, Ser. No. 788,115
4 Claims. (Cl. 332—19)

The present invention relates to frequency modulation of an oscillator, and more particularly to a novel arrangement for varying the frequency of a stabilized oscillator in accordance with a control voltage or modulating signal.

An oscillator which is effectively stabilized, especially by a feedback loop, may not readily have its frequency varied or be frequency modulated by a control voltage or modulating signal, since the feedback loop which exercises control of the oscillator to maintain a constant relationship of its frequency with respect to a standard tends strongly to defeat attempts at frequency modulation.

In accordance with the present invention, the feedback loop which stabilizes the oscillator includes a filter having characteristics such that hold-in and pull-in action are adequate while allowing control of the oscillator by an applied signal to provide frequency modulation. Further, in accordance with the invention, the control voltage or modulating signal is applied in such a manner as to be effective in the feedback loop which stabilizes the oscillator.

An object of the present invention is to provide novel means for modulating the frequency of an oscillator otherwise normally locked in definite frequency relationship with a source of standard frequency.

Another object of the present invention is to provide the feedback loop for control of an oscillator by a local standard, in a novel manner, with a filter having characteristics whereby to permit adequate frequency modulation of the oscillator, while maintaining the lock-in or hold-in action exercised by the standard.

A further object of the present invention is to provide a pulse locked oscillator of novel form.

Other objects and advantages of the invention will, of course, become apparent and immediately suggest themselves to those skilled in the art to which the invention is directed from a reading of the following specification, together with the accompanying drawing, in which.

Figure 1:
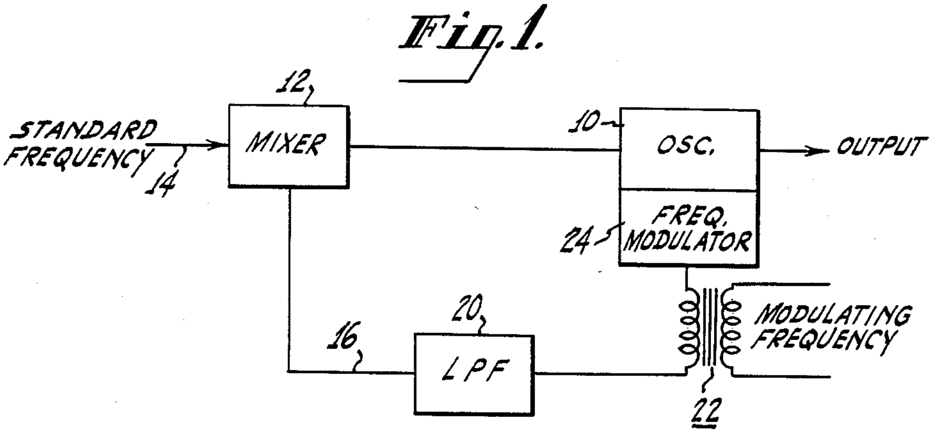
FIG. 1 is a schematic diagram of a frequency modulation system embodying the invention.
Figure 2:
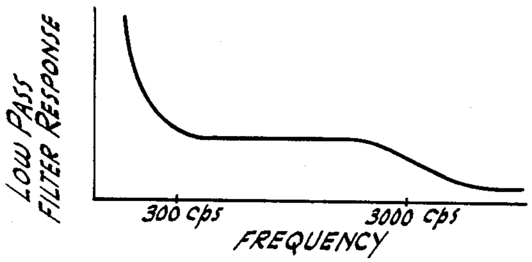
FIG. 2 shows, by way of example, the response characteristics of a lowpass filter suitable for use in the system of FIG. 1.
Figure 4:
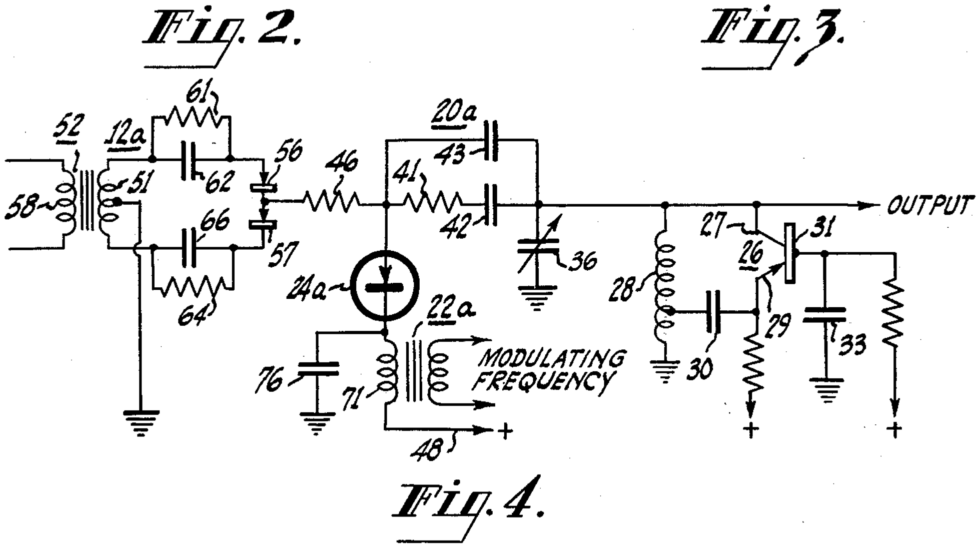
FIG. 4 is a more detailed schematic showing of a frequency modulation system embodying the arrangement of FIG. 1 in modified form.

Referring to the drawing and for the present to FIG. 1, reference character 10 designates an oscillator capable of oscillation in a range of frequencies suitable to a designated system employing the frequency modulation system of FIG. 1. The oscillator 10 may be of any kind or type capable of being controlled to provide frequency variation or deviation in accordance with a control voltage or modulating frequency and may be a vacuum tube oscillator or a transistor oscillator. In the more detailed description which is to follow, by way of example, this oscillator as it appears in more detail in the modified form of FIG. 4 is shown as a transistor oscillator. Suggested rest frequencies of this oscillator lie in the range of 18 or 25 mc. (megacycles). A discriminator 12, one form of which is shown by way of example in FIG. 4, receives an input from a standard frequency source over a connection designated schematically at 14. The standard frequency source may be of any known kind or type, for example, a crystal controlled oscillator provided with shaping circuitry so as to furnish a pulse input at standard frequency to the connection 14. In the illustrative example, the pulse frequency input or pulse repetition rate may be one megacycle/sec. This will lock in each 1 mc. harmonic in the range of the oscillator, which was given by way of example as 18 to 25 mc. A feedback loop connection shown schematically and indicated by reference character 16 includes a lowpass filter 20. In the system of FIG. 1, which discloses a frequency modulation system in accordance with the present invention, the filter 20 preferably has the response characteristic shown in FIG. 2. The low frequency rising characteristic gives a strong hold-in action. In the example of FIG. 2, and with the frequency ranges given by way of example, if the oscillator must have a pull-in frequency range greater than 3 kc., then the flat portion of the lowpass filter characteristic may be extended up in frequencies if desired.

The feedback loop 16 also includes a coupling or connection 22 to provide introduction of a modulating frequency into the feedback loop to operate a frequency modulator 24 which causes frequency modulation or deviation of the output frequency of the oscillator 10 in accordance with the modulating signal supplied to the coupling 22. The modulator 24 may be of any suitable kind or type operable in response to an applied frequency modulating signal, and in FIG. 4 of the drawing it is indicated as being a variable capacitance diode 24*a*. The variable capacitance diode 24*a* may be a silicon diode and in one available form it is known as a "Varicap."

Figure 3:
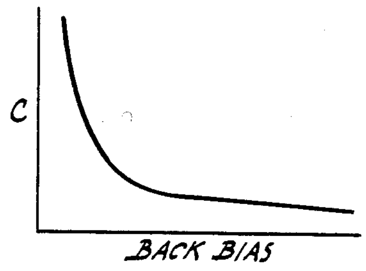
FIG. 3 is a curve showing the variation in capacitance of a variable capacitance diode suitable for effecting frequency modulation in a system embodying the present invention.

FIG. 3 of the drawing shows the characteristic of the variable capacitance diode when a back bias voltage is applied. This change in capacitance is employed in the illustrative embodiment of FIG. 4 to obtain frequency modulation and to provide for frequency control. It will be understood that the variable capacitance diode 24*a* is shown in FIG. 4 by way of example, and that the frequency modulator 24 of FIG. 1 may serve both purposes. The latter may be of the reactance tube type operating with an oscillator 10 of the tube type. The control voltage from the mixer 12 will then be operative in conjunction with the modulating frequency introduced into the control loop.

Referring now to FIG. 4 in more detail, a transistor 26 is connected in a Hartley oscillator circuit in the manner shown. The collector 27 of the transistor is connected to a tapped inductor 28 serving as the oscillator tank coil. The biased emitter 29 is connected through a capacitor 30 to a tap on the inductor 28. The end of the inductor 28 opposite the connection to the collector 27 is connected to a point of reference potential schematically designated as ground. The semi-conductive body providing the base 31 of the transistor is biased as indicated and is connected to ground by way of a capacitor 33. The previously mentioned biases for the transistor elements may be obtained in any known manner, for example, by a battery or power supply having a tapped grounded terminal or having its negative terminal grounded.

The inductor 28 is shunted by a variable tuning capacitor 36. The resonant circuit comprising the elements 36 and 28 may be tuned to a desired frequency which is to serve as the carrier frequency for the frequency modulation system of FIG. 4. As suggested above, carrier frequencies may, in the illustrative example and with circuit values to be given by way of example, lie in the range of from 18 to 25 mc.

The lowpass filter, designated generally by the reference character 20*a*, corresponds in function to the lowpass filter 20 in FIG. 1 and in the embodiment of FIG. 4 it also has the response characteristic shown in FIG. 2. By way of example, the pass band between 300 cycles per second and 3000 cycles per second is shown as being substantially flat and it is within this range that frequency modulation is imposed on the oscillator comprising the transistor 26. The characteristic of the filter 20*a* is provided by a resistor 41 in series with a capacitor 42. This resistor capacitor combination is shunted by a capacitor 43. Solely by way of example, the resistor 41 has a value of 200,000 ohms and the capacitor 42 has a value of 4000 mmf. Also, solely by way of example, the capacitor 43 has a value of 200 mmf. The complex impedance of the filter 20*a* in combination with a resistor 46 couples the oscillator to the discriminator 12*a*. The resistor 46 which serves as an isolation resistor has a value, for example, of 1000 ohms. The filter 20*a* serves as an integrating element and the D.C. error signal appears at the end of the resistor 46 opposite its connection to the discriminator 12*a*. In this manner the error signal is added to or subtracted from the back bias applied on a conductor 48 to the variable capacitance diode 24*a*.

The discriminator 12*a* includes as an element the secondary 51 of a pulse transformer 52. Two diodes 56 and 57 are connected in series effectively across the transformer secondary 51. The polarity of the control pulses applied to the primary 58 of the transformer 52 is assumed to be such that the pulses appearing in the secondary 51 are of positive polarity as applied to the anodes of the diodes 56 and 57. The connection to the anode of diode 56 includes a resistor 61 connected in parallel with the capacitor 62. The connection to the cathode of the diode 57 includes a resistor 64 shunted by a capacitor 66. The mid tap 63 of the secondary 51 is grounded, as shown on the drawing, to complete the coupling of the oscillator to the discriminator 12*a*. When the pulses of opposite polarity produced at the ends of the secondary winding 51 are applied to the diodes 56 and 57 they will conduct simultaneously to provide a switching action which samples the sinusoidal voltage wave of the oscillator. If the frequency of the pulse input representing the fixed standard frequency is, for example, one-tenth of the frequency of the oscillator, the same point of the oscillator sine wave will be sampled each time a pulse is applied for switching and the capacitors of the filter 20*a* will hold a constant charge. If the relative phasing of the pulses and the sinusoidal output of the oscillator 16 are slightly changed, a different portion of the sine wave will be sampled and the capacitors of the filter 20*a* will charge or discharge through the path provided by the discriminator 12*a*. The developed unidirectional voltage influences the capacitance of the variable capacitance diode so as to adjust the resonant frequency of the oscillator tank circuit.

The modulating frequency which is applied in series with the variable capacitance diode 24*a* is introduced by the secondary 71 of the transformer 22*a*. A capacitor 76 serves as a bypass for the oscillator frequency.

While the description herein indicates that pulses derived from a standard frequency source are applied to the transformer primary 58, it will be understood that a sine wave may be applied to the transformer primary 58. With pulse operation of the discriminator 12*a*, it can be assumed the pulse occurs at the time the oscillator sine wave passes through the zero axis and that as the phase of the oscillator changes, for example when the oscillator tends to increase in frequency, the correcting voltage will be of one polarity because of the addition of the pulse and the sine wave, for example on the positive going portion of the sine wave. The reverse of this effect will be obtained when the oscillator tends to decrease the frequency of its output.

The values of the circuit elements heretofore given, it will be understood, are given solely by way of example and in connection with an illustrative embodiment of applicant's invention.

What is claimed is:

1. A system for frequency modulating a wave in correspondence with the amplitude of a signal, said system comprising a wave generator provided with a resonant circuit having a variable capacitance diode coupled thereto for controlling the frequency of said circuit, means operative to couple said signal to said diode, means to derive an output signal from said generator representative of the frequency thereof, means to derive a signal having a constant frequency related to the unmodulated frequency of said generator, a discriminator having an output circuit, means to supply said signal from said generator and said signal having a constant frequency to said discriminator whereby to provide a unidirectional control signal in said discriminator output circuit, said means to supply said signal to said discriminator from said generator including a lowpass filter, said discriminator output circuit and said means to derive said output signal from said generator having a portion which coincides, said lowpass filter having a low attenuation below the frequency range of said signal, and means operative to couple said discriminator output circuit to said diode.

2. A system for frequency modulating a wave in correspondence with the amplitude of a signal comprising a frequency controllable wave generator, a variable capacitance diode serving as a frequency modulator responsive to said signal, a source of direct current voltage for said diode, a discriminator, a source of signal energy in the form of periodically occurring pulses, said pulses occurring at a frequency which is harmonically related to but less than the frequency of said wave produced by said controllable wave generator, means for associating said source of direct current voltage, said diode, said discriminator and said source of periodically occurring pulses in a series circuit, a lowpass filter connected to said frequency controllable wave generator and said series circuit between said variable capacitance diode and said discriminator, and means connecting a point in said series circuit between said diode and said discriminator to said frequency controllable wave generator whereby to vary the frequency of said generator in accordance with said signal.

3. A system for frequency modulating a wave in correspondence with the amplitude of a signal, said system comprising a wave generator provided with a resonant circuit having a variable capacitance diode coupled thereto for controlling the frequency of said circuit, means operative to couple said signal to said diode, means to derive an output signal from said generator representative of the frequency thereof, means to derive a signal having a constant frequency related to the unmodulated frequency of said generator, a discriminator having an output circuit, means to supply said signal from said generator and said signal having a constant frequency to said discriminator whereby to provide a unidirectional control signal in said discriminator output circuit, said means to supply said signal to said discriminator from said generator including a lowpass filter, said discriminator output circuit and said means to derive said output signal from said generator having a portion which coincides, said lowpass filter having a low attenuation below the frequency range of said signal and a flat band of medium attenuation substantially coextensive with the frequency range of said signal, and means operative to couple said discriminator output circuit to said diode.

4. A system for frequency modulating a wave in correspondence with the amplitude of a signal, said system comprising a wave generator provided with a resonant circuit having a variable capacitance diode coupled thereto for controlling the frequency of said circuit, means operative to couple said signal to said diode, means to derive an output signal from said generator representative of the frequency thereof, means to derive a signal having a constant frequency related to the unmodulated frequency of said generator, a discriminator having an output circuit, means to supply said signal from said generator and said signal having a constant frequency to said discriminator whereby to provide a unidirectional control signal in said discriminator output circuit, said means to supply said signal to said discriminator from said generator including a lowpass filter, said discriminator output circuit and said means to derive said output signal from said generator having a portion which coincides, said lowpass filter having a low attenuation below the frequency range of said signal, a flat band of medium attenuation substantially coextensive with the frequency range of said signal and a higher attenuation at frequencies above the frequency range of said signal, and means operative to couple said discriminator output circuit to said diode.

References Cited in the file of this patent

UNITED STATES PATENTS

| | | |
|---|---|---|
| 2,573,447 | Janssen | Oct. 30, 1951 |
| 2,605,425 | Hugenholtz | July 29, 1952 |
| 2,644,138 | Bond | June 30, 1953 |
| 2,697,815 | Hugenholtz | Dec. 21, 1954 |
| 2,708,739 | Bucher | May 17, 1955 |
| 2,773,241 | Hugenholtz | Dec. 4, 1956 |
| 2,958,768 | Brauer | Nov. 1, 1960 |
| 2,962,666 | Pollak | Nov. 29, 1960 |